United States Patent [19]

Cawelti et al.

[11] Patent Number: 5,459,672
[45] Date of Patent: Oct. 17, 1995

[54] ELECTRICAL INTERCONNECT INTEGRITY MEASURING METHOD

[75] Inventors: Dale W. Cawelti, Carlsbad; Daniel D. Evans, Jr., Oceanside; John B. Gabaldon, San Diego, all of Calif.

[73] Assignee: Hughes Aircraft Company, Los Angeles, Calif.

[21] Appl. No.: 15,271

[22] Filed: Feb. 5, 1993

Related U.S. Application Data

[63] Continuation of Ser. No. 559,737, Jul. 30, 1990, abandoned.

[51] Int. Cl.$^6$ .................................................. B23K 1/002
[52] U.S. Cl. .......................... 364/489; 228/4.5; 228/1.1; 228/103
[58] Field of Search .................................. 364/488, 489; 228/1.1, 4.5, 102, 103, 104

[56] References Cited

U.S. PATENT DOCUMENTS

| | | | |
|---|---|---|---|
| 3,973,713 | 8/1976 | Furuya et al. | 228/4.5 |
| 4,239,144 | 12/1980 | Elles et al. | 228/1.1 |
| 4,266,710 | 5/1981 | Bilane et al. | 228/1.1 |
| 4,373,653 | 2/1983 | Salzer et al. | 228/1.1 |
| 4,438,880 | 3/1984 | Smith et al. | 228/1.1 |
| 4,555,052 | 11/1985 | Kurtz et al. | 228/104 |
| 4,586,642 | 5/1986 | Dreibelbis et al. | 228/4.5 |
| 4,597,519 | 7/1986 | Kurtz et al. | 228/102 |
| 4,603,802 | 8/1986 | Kurtz et al. | 228/1.1 |
| 4,815,001 | 3/1989 | Uthe et al. | 228/103 |
| 4,855,928 | 8/1989 | Yamanaka | 364/489 |
| 5,046,654 | 9/1991 | Yamazaki et al. | 228/1.1 |

*Primary Examiner*—Vincent N. Trans
*Attorney, Agent, or Firm*—Terje Gudmestad; W. K. Denson-Low

[57] ABSTRACT

A method of bond quality monitoring wherein a bonding machine is fitted with a touchdown mechanism including a pair of contacts (23, 24), which normally open upon touchdown of a bonding tool (27) raised and lowered by a bond head carriage (13). As the tool (27) is lowered towards a bonding surface (31), the bonding machine's computer (61) performs a test (103) to sense production of a touchdown signal produced by opening of the contacts (23, 24). If touchdown is sensed, the carriage (13) proceeds to an overtravel position. Upon reaching the overtravel position, a second test (108) is performed to confirm touchdown, and energy is then applied to the bond site. During energy application, the logic state of the touchdown mechanism is checked to ensure that the contacts do not close for example to check for application of inadequate force during bonding. If a contact closure is sensed, the bond site location is logged for further examination such as a nondestructive pull test. When the carriage ascends, the distance it travels before closure of the contacts (23, 24) is used as a measure of bond deformation and, hence, bond quality.

8 Claims, 4 Drawing Sheets

ELECTRICAL INTERCONNECT INTEGRITY MEASURING METHOD

This is a continuation of application Ser. No. 559,737, filed Jul. 30, 1990 now abandoned.

BACKGROUND OF THE INVENTION

1. Field of the Invention

The subject invention relates generally to electrical circuit fabrication and, more particularly, to a method and apparatus for measuring the quality of interconnection made by a bonding machine as it operates.

2. Description of Related Art

In the prior art, wirebonders are known for establishing wire interconnection to electrical contacts, for example, between an integrated circuit (IC) pad and substrate gold. One such commercially available wirebonder is the Model HMC 2460 thermosonic wirebonder available from Hughes Aircraft Company. Such a wirebonder includes an ultrasonic transducer, an ultrasonic feedhorn, and a bond tool or capillary. Mechanical force and ultrasonic energy are applied to the capillary to create a wirebond between a bond surface and a gold ball having a diameter of, e.g., 0.7 to 2.0 mils.

In operation, the wirebonder applies heat to the bond site via a heated stage located underneath the bond surface. Force is applied by pressing the capillary down toward the bond surface. An ultrasonic signal is generated by the generator and converted to a mechanical ultrasonic frequency vibration of the feedhorn by the transducer. The capillary transmits the ultrasonic energy and downward force, effectively "scrubbing" the gold ball against the bond surface. The combination of heat, force, and ultrasonic vibration causes bonding between the bond surface and the gold ball.

Wirebonds formed by wirebonding apparatus have typically been required to go through laborious and expensive testing. For example, current military requirements specify internal visual inspection for determining the integrity of wirebonds and other microcircuit interconnections. Visual inspection of wirebonds has become a costly task. Production operators may review hundreds of thousands of initial build wirebonds and rework build wirebonds in a normal week. Given such facts, the industry has been moving towards automated methods for testing and verifying the integrity of interconnections such as those made by wirebonders. One such approach has been that referred to as bond signature analysis, such as the method disclosed in the copending U.S. Application of Owen E. Gibson et al. for a Bond Signature Analyzer, assigned to Hughes Aircraft Company, wherein an electrical signal indicative of bond quality is sampled and analyzed to determine bond quality. While useful, bond signature analysis has the disadvantage of being relatively complex and expensive to implement.

SUMMARY OF THE INVENTION

Accordingly, it is an object of the invention to provide a method of measuring the quality of electrical interconnections;

It is another object of the invention to provide a method of measuring the quality of interconnections made by a wirebonding apparatus; and It is another object of the invention to provide such a method which is relatively simple and less expensive to implement.

According to the invention, the touchdown mechanism of a bond head on a bonding machine is used to make a bond integrity measurement. The touchdown mechanism is typically used to sense the touching of the bonding tool on its target surface before energy is applied from the bonding tool to the target surface for interconnect (bonding).

The relatively simple touchdown mechanism and its movement dynamics during the interconnect (bonding) process allows a method of determining interconnect integrity. According to one aspect of this method, the relative distance traveled between the bonding tool and its supporting carriage is measured after bonding; the information gleaned indicates interconnect (bond) integrity. The information can be logged by the bonding machine's computer for statistical process control methods, or as a listing of possible weak interconnect locations.

Another aspect of the method provides a measure of the quality of the interconnection process as the bonding machine operates by detecting whether the contacts close during application of bonding energy. The information can be used to correct the process on a next interconnect location basis, to log information for statistical control of the interconnect process, to alert the user to possible weak interconnect (bonding) sites, and to inform the operator of a malfunctioning bonding machine. The method can be applied to wire, die, and TAB bonding machines.

BRIEF DESCRIPTION OF THE DRAWINGS

The preferred embodiment of the present invention, both as to its organization and manner of operation, together with further objects and advantages, may best be understood by reference to the following description, taken in connection with the accompanying drawings, of which.

DETAILED DESCRIPTION OF THE PREFERRED EMBODIMENTS

The following description is provided to enable any person skilled in the art to make and use the invention and sets forth the best modes contemplated by the inventors of carrying out their invention. Various modifications, however, will remain readily apparent to those skilled in the art, since the generic principles of the present invention have been defined herein specifically to provide a particularly efficient and useful bond integrity measurement method.

Figure 1:
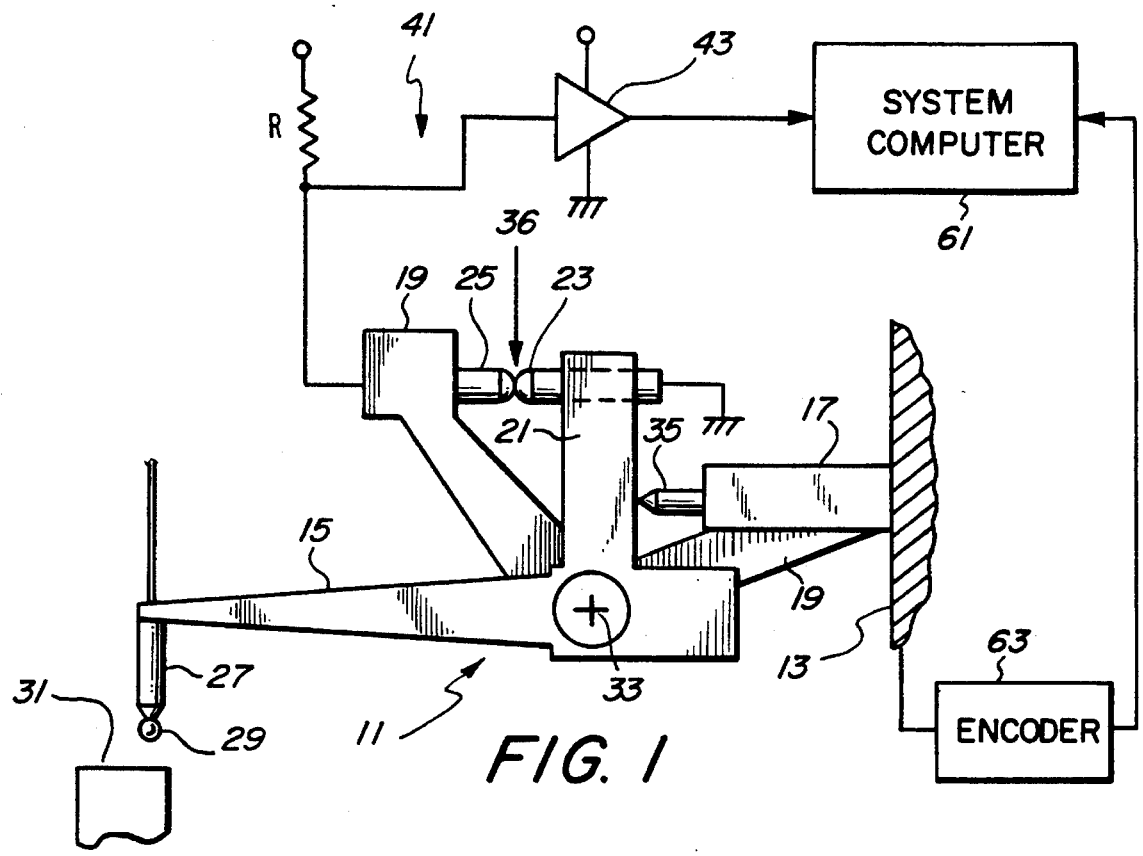
FIGS. 1–5 are schematic diagrams of bonding apparatus at various stages of operation and useful in illustrating the preferred embodiment.

FIG. 1 illustrates a ball bonder apparatus 11 including a bond head carriage 13, an ultrasonic transducer 15, a force actuator 17, and a rigid touchdown sensor arm 19 fixed to the bond head carriage 13. The ultrasonic transducer 15 includes an integral, vertical member 21 mounting a moving touchdown contact 23, which cooperates with a fixed touchdown contact 25 located on the touchdown sensor arm 19. The ultrasonic transducer 15 further includes a bonding tool 27, which applies a wire ball 29 to a target surface 31. The bonding tool 27, typically a capillary, is pivotally linked to the touchdown sensor arm 19 to pivot about a point 33 in response to actuation of the piston 35 of the force actuator 17 and the overtravel. The bonding tool 27 is raised and lowered by vertical up/down movement of the bond head carriage 13 with respect to its frame (not shown). Movement of the bond head carriage 13 is controlled by a system computer 61 and monitored by a position encoder 63, which supplies a position feedback signal to the computer 61.

Electrically, the moving touchdown contact 23 is grounded, while the fixed touchdown contact 25 connects to a logic circuit 41. More particularly, the contact 25 is connected to a resistance R and to the input of an amplifier/logic circuit 43.

In operation, before an interconnect (bond) is made, the bond head carriage 13 carrying the bonding tool 27 descends until the bonding tool 27 is near the interconnect target, typically 0.008 inches from the target surface 31. The bond head carriage 13 then slows to a fixed search velocity and maintains this search velocity until the bonding tool 27 carried by the ultrasonic transducer 15 touches the interconnect target surface 31. Note that the bonding tool 27 may be carrying wire, an integrated circuit die, or a bare noncapillary if the machine is a wire bonder, die bonder, or Tape Automated Bonding bonder, respectively. If the machine is a wire bonder, wire may be located at the tip of the bonding tool and may be in the form of a ball or a column (stitch).

Figure 2:
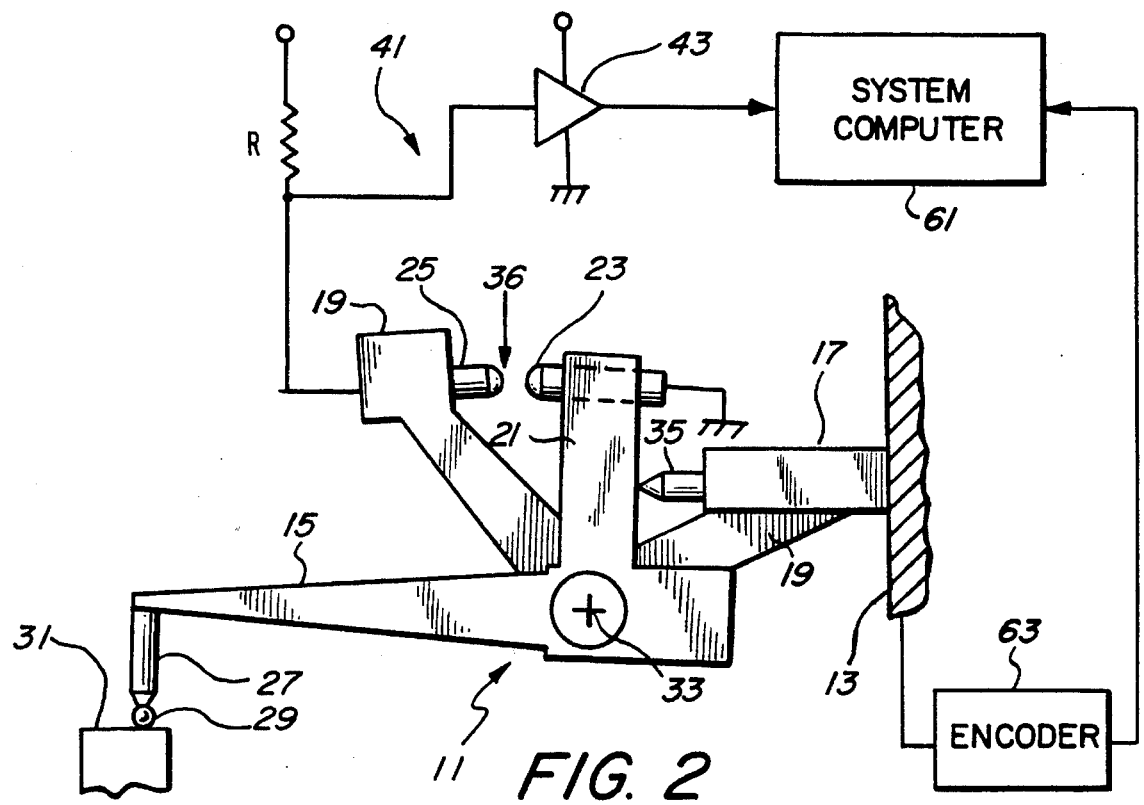

At the instant before contact with the interconnect target surface 31, the touchdown mechanism contacts are held closed together and at a reference position 36 by the force actuator 17. This reference position 36 is shown in FIG. 1. The force applied by actuator 17 is a value which is programmed as part of the conventional interconnect process. The instant after the wire ball 29 and, thus, the bonding tool 27 contacts its target 31, the touchdown mechanism's contacts 23, 25 open; i.e., they move from their reference position 36, as shown in FIG. 2. Opening of the contacts 25, 27 causes the bonding machine to receive an output signal from the logic circuit 43 and to thus sense that the target 31 was contacted. The programmed force continues to be applied to the bonding tool 27 and, thus, to the interconnect target 31. The bond head carriage 13 will continue its downward motion and overtravel the actual touch position by a programmed distance, although the bonding tool 27 is stopped by the target 31. The overtravel is a programmed distance moved by the bond head carriage 13 toward the interconnect target 31 after the contacts 23 and 25 have separated. As overtravel occurs, the touchdown mechanism's contacts 23 and 25 move a further distance from their reference position.

Figure 3:
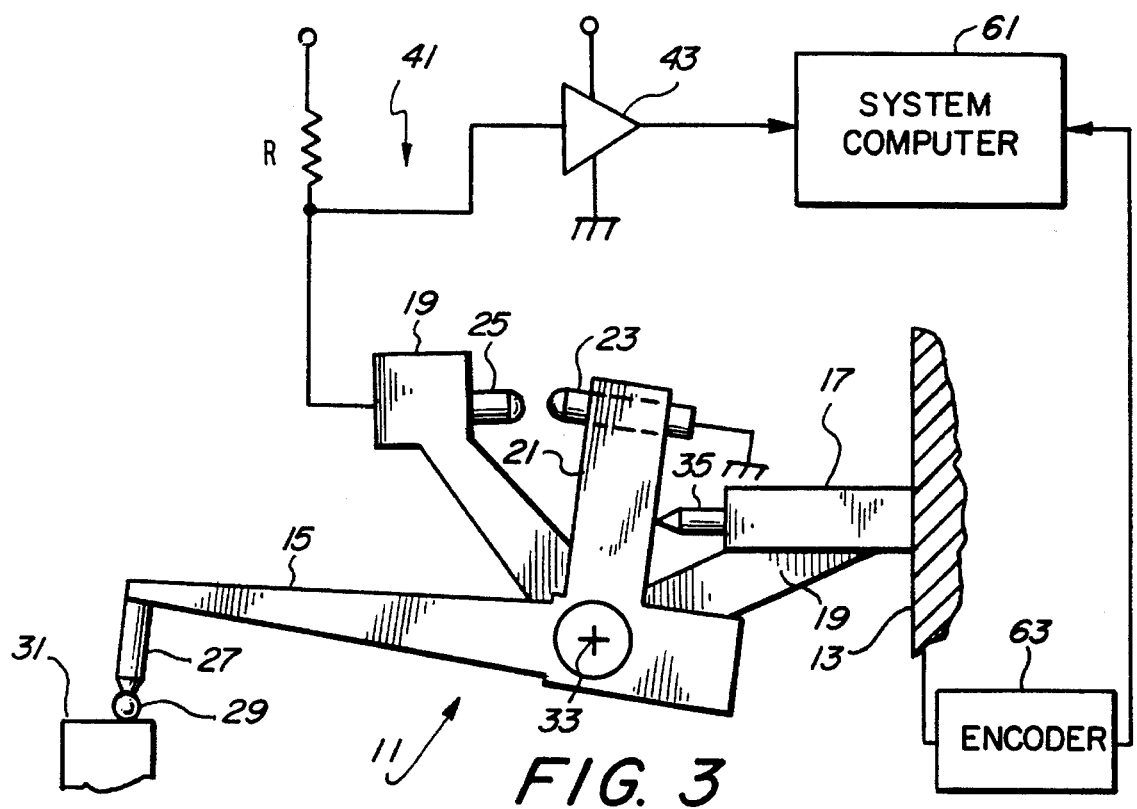

When the programmed overtravel of the bond head carriage 13 is complete, as illustrated in FIG. 3, a programmed amount of energy is applied to the bonding tool 27. The energy is typically force and mechanical ultrasonic motion, and is programmed by amplitude and time. As the energy is applied and bonding occurs, the wire 29 and surface 31 deform where the bonding tool 27 is contacting. The force acting on the bonding tool 27 during the deformation pushes the bonding tool 27 down and closer to the interconnect surface 31, causing the touchdown mechanism contacts 23, 25 to move back towards their reference position 36 as the bonding tool 27 moves down.

If the moving contact 23 moves all the way back to the reference point 36 shown in FIG. 1 during bonding, there is a good indication that mechanical force, one of the three important parameters of bonding, was not applied during the entire process time. The bonding machine can react in at least two ways to such an indication: (1) it can log the occurrence of incomplete force at that interconnect site, or (2) it can monitor the touchdown mechanism's contacts 23, 25 during the process time, and if the reference point 36 (contact closure) is sensed, the bonding machine's computer 61 can command the bond head carriage 13 to overtravel an additional distance. This second alternative ensures that force is applied during the entire process time.

Moreover, after the interconnect bonding process is complete, the bond head carriage 13 and the bonding tool 27 ascend away from the interconnect target 31. The distance the bond head carriage 13 must move during this ascent until the bonding tool 27 lifts off the target 31 and causes the touchdown mechanism's contacts 23, 25 to return to their reference position 36 can be measured, and that distance can be used as a measure of deformation of the interconnect site. The deformation information may also be used as an indication of bond quality.

Moreover, the touchdown mechanism's contacts 23, 25 are used to prevent against a false indication of contact with the target surface. Such a false indication is often caused by bonder machine disturbances: damaged wire; bearing friction spots; damaged, worn, or clogged bonding tool; etc. The instant after the (false) contact is sensed, the bonding machine is programmed to delay a period of about the mechanical time constant of the touchdown mechanism. After the selected delay, the bonding machine checks the touchdown mechanism's contacts 23, 25 again; if they are at their reference position 36, the bonding machine re-commands a search velocity until the touchdown mechanism senses touchdown; again, the touchdown contacts 23, 25 are checked against false contact, ad infinitum.

In the preferred embodiment of the foregoing method, the touchdown mechanism contacts 23, 25 are used to recover against false touchdown and to ensure that force was applied to the interconnect site during the entire programmed process time. If force was not applied during the entire process time, the occurrence is logged in the memory of the controlling computer. The number of occurrences of false touchdown and corrupted force is accessible to the operator of the bonding machine through a keyboard memory access operation and may be used in process refinement, or as an indication of bonder machine performance. The preferred method may be used with commercially available apparatus such as the Hughes Model 2460-III automatic ball, Model 2470-III automatic wedge, and Model 2900A automatic TAB bonders.

The preferred method and apparatus will now be described in a sequential, step-by-step fashion in connection with FIGS. 1–5 and the flow chart of FIG. 6.

Sequence:

FIG. 1: The bond head carriage 13 with bonding tool 27 and wire 29 are lowered under computer control toward the interconnect target site 31, step 101 of FIG. 6. During this downward travel, the touchdown mechanism contacts 23, 25 are closed, which puts the logic electronics 41 in logic state 0. The programmed force is delivered from the force actuator 17 and acts to hold the contacts 23, 25 together. While the tool is lowering, the system software performs a test for touchdown, test 103 in FIG. 6. As long as touchdown is not sensed, path 104 is followed and the tool 27 continues to lower.

FIG. 2: The instant after the wire 29 and bonding tool 27 contacts the target 31 the bonding tool's motion is stopped, and the touchdown mechanism's contacts 23, 25 separate via the pivoting of the ultrasonic transducer 15 relative to the bond head carriage 13. The logic electronics 41 are changed to state 1, which is detected as touchdown by the system software test 103. Force is now being delivered to the target site 31. The bond head carriage 13 is still traveling down to its programmed overtravel distance. During the downward travel, the system performs a test 105 to determine whether the overtravel position has been reached. Overtravel is detected by computer 61 when the bond head carriage 13 has traveled a selected (programmed) distance after touch was sensed.

FIG. 3: At the overtravel distance, the bond head 13 stops its downward travel. The force is still being delivered to the target site 31. All motion is stopped. The touchdown sensor is rechecked for false sense of touchdown (see FIG. 6). Test 105 is now satisfied and test 108 is performed to recheck the touch signal output by amplifier 43. This test ensures that touchdown was not falsely sensed during test 103, for example, as a result of system aberrations such as a clogged capillary tool, mechanical wear, or worn contacts. If touchdown is not confirmed by test 108, the tool restarts its downward travel and the flow proceeds back to the beginning, test 101.

Figure 4:
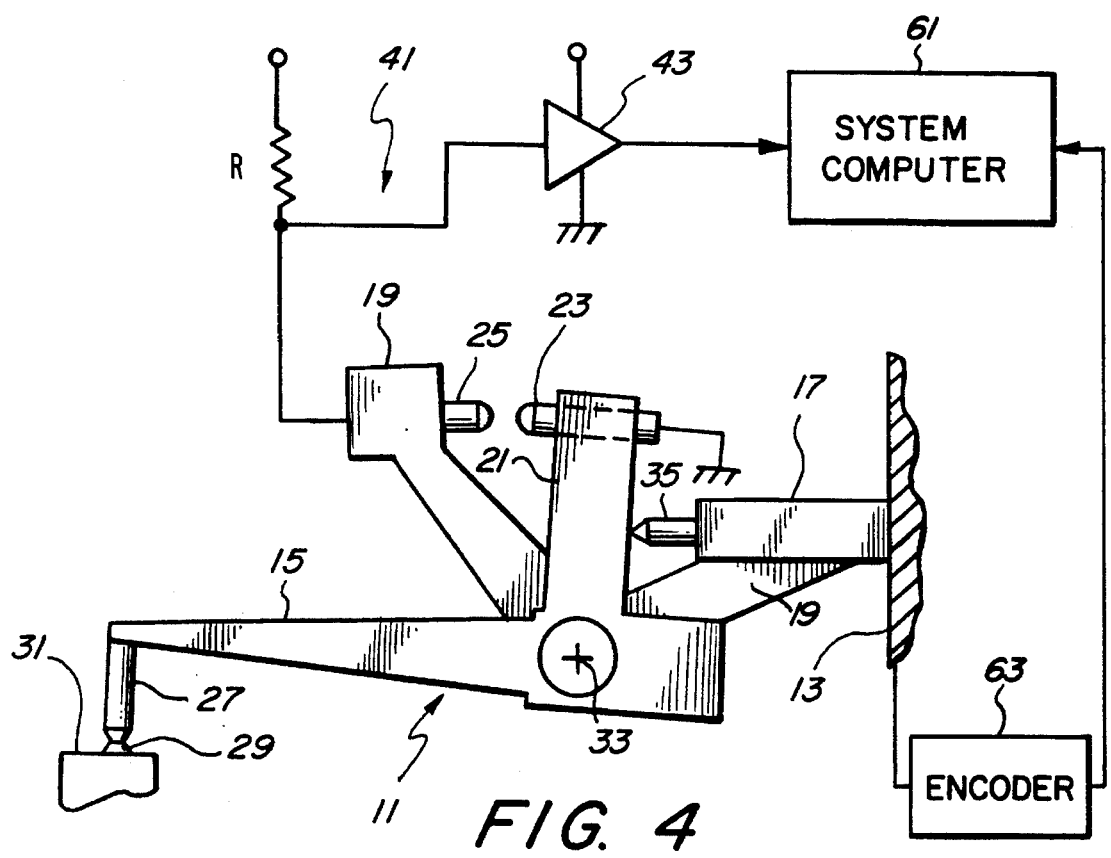

FIG. 4: When the overtravel position is reached and the bond head 13 is stopped and there is a valid touch sense, test 108 is satisfied and bonding energy is applied to the bonding tool 27, as indicated by step 107 of FIG. 6. This application of bonding energy causes the wire 29 to deform. As wire deformation occurs, the bonding tool 27 moves downward and its pivoting about point 33 causes the touchdown contacts 23, 25 to move closer together.

In a good bonding process, at the end of process time tested for in step 109, the touchdown mechanism's contacts 23, 25 should not be touching. If they are not, the bond head carriage 13 will ascend, step 115. The bonding machine's computer measures the distance that the bond head carriage 13 ascends, step 115, until the touchdown mechanism's contacts touch. This measurement is preferably achieved by storing the output of a position encoder at the time of occurrence of an interrupt generated in response to closure of the contacts 23, 25, i.e., the return to a logic state 0. When the contacts touch, that value is used to compute the wire deformation (TAB deformation, I.C. depth into epoxy, etc.). The computed value is logged into a bond quality data file.

Figure 5:
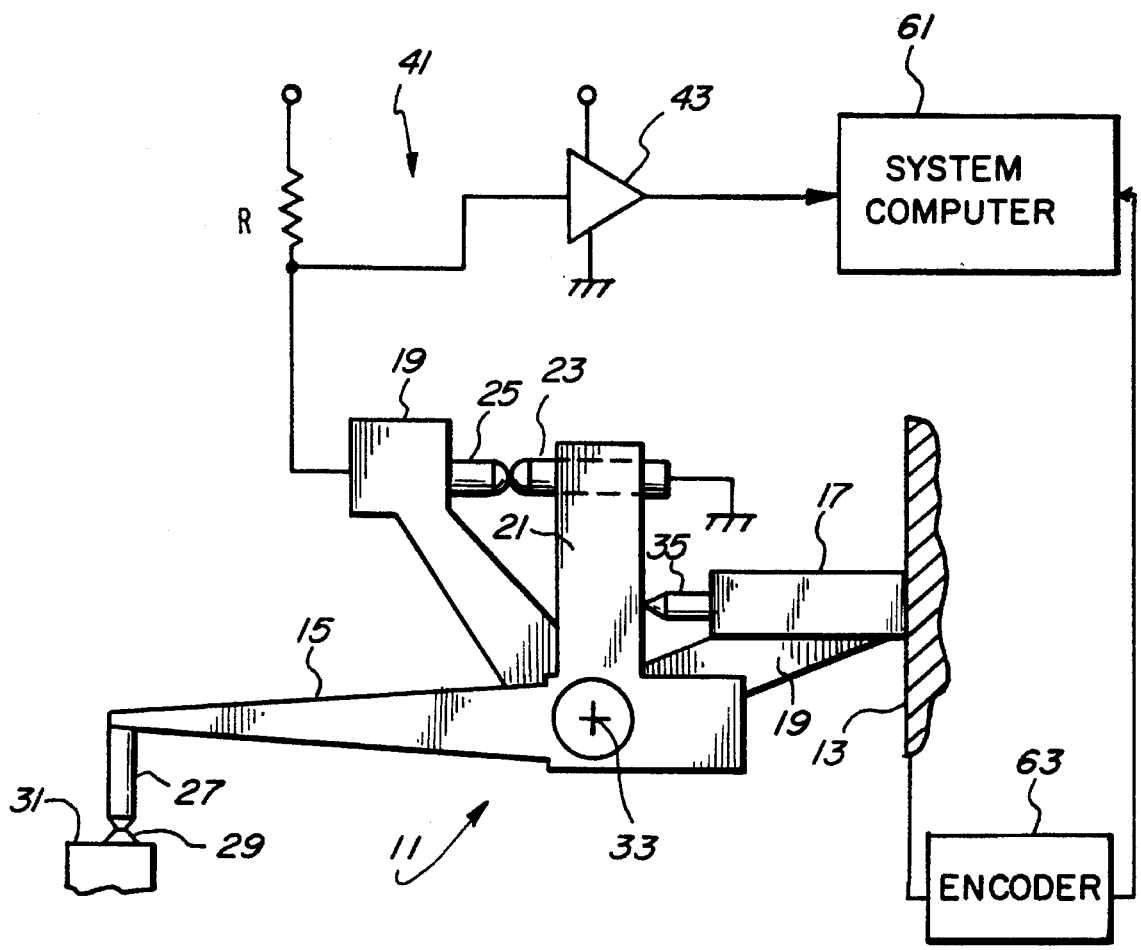
Figure 6:
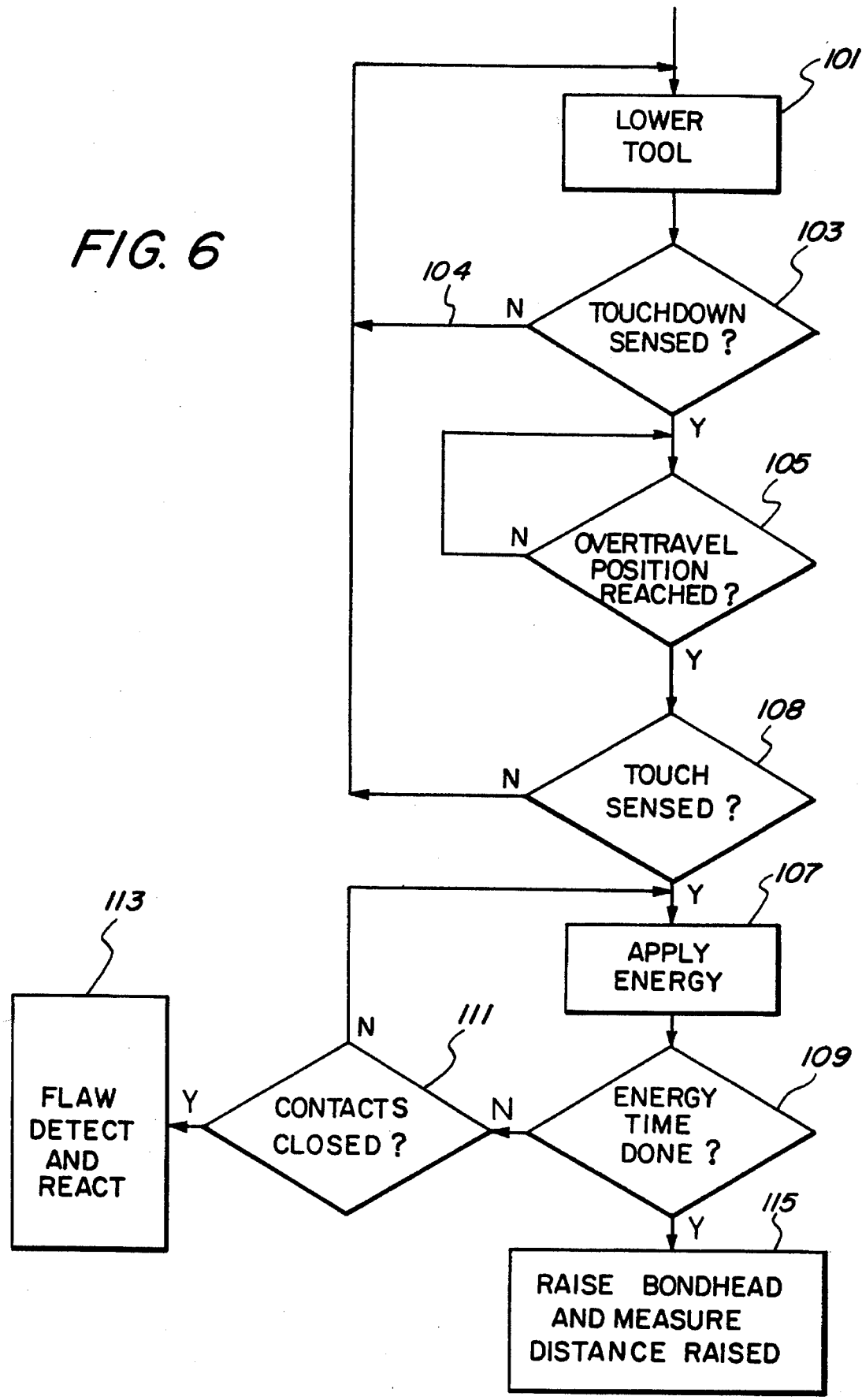
FIG. 6 is a flow chart useful in illustrating the method of the preferred embodiment.

FIG. 5: In a flawed bonding process, the contacts 23, 25 can close during the time that energy is applied, for example, causing the force not to be applied during the entire bonding process. The logic electronics 41 then change to state 0, causing test 111 of FIG. 6 to be satisfied. In such case, force will not be delivered to the target 31, but to the touchdown mechanism's contacts 23, 25, and poor interconnect is likely. In response to detection of logic 0 during application of energy, the bonding machine may move the bonding head 13 downward to correct for the problem, and its computer may log information such as the location of the interconnect site. A nondestructive pull test or other testing of the logged site may then be performed.

The foregoing method of wire bonding may be extended to die attach, and TAB bonding, and to any interconnect process which uses a similar mechanism. With respect to die attach bonding, IC dies are placed into epoxy at the target site. They are then pushed down into the epoxy to ensure the IC dies have a good epoxy bond with the substrate. The depth to which they are pushed is important for thermal, wire, and TAB attachment requirements, and can be monitored by procedures analogous to those described above. The TAB bonding process is similar to the wire bonding process, except that the bonding tool is a bare capillary: the wire for interconnect is already placed at the interconnect site.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. For use with a bonding apparatus wherein a bond head carriage is lowered under computer command to an overtravel position with respect to a bond site, and thereafter controlled to ascend away from said bond site after creation of a bond, and including a means for producing a touchdown signal upon sensing touchdown of a bonding tool mounted to said bond head carriage by monitoring the open/close state of a pair of contacts, said bonding apparatus further applying energy for a selected time to said tool to create said bond, the method comprising the steps of:

testing for occurrence of said touchdown signal prior to commanding said overtravel position;

responding to the occurrence of said touchdown signal by lowering said carriage to said overtravel position;

performing a bonding operation; and computing the distance said carriage moves during the time interval between the beginning of its ascension away from said bond site and the occurrence of a change in said open/close state, said distance providing a measure of bond quality.

2. The method of claim 1 further including the step of testing for lack of occurrence of said touchdown signal prior to application of said energy.

3. The method of claim 2 wherein said testing for lack of touchdown comprises a false touchdown test.

4. The method of claim 1 further including the step of monitoring said sensing means to detect loss of force during bonding.

5. The method of claim 4 wherein, if loss of force is detected, additional overtravel is commanded.

6. The method of claim 4 further including the step of logging occurrence of a lost force detection.

7. The method of claim 1 wherein the distance said bond head ascends prior to a said change of state comprises a measure of bond deformation.

8. For use with a bonding apparatus wherein a bond head carriage is lowered under computer command to an overtravel position with respect to a bond site, and thereafter controlled to ascend away from said bond site after creation of a bond, and including a means for producing a touchdown signal upon sensing touchdown of a bonding tool mounted to said bond head carriage by monitoring the open/close state of a pair of electrically conductive contacts, said open/close state changing a first time upon touchdown and a second time thereafter as said carriage ascends away from said bond site, said bonding apparatus further applying energy for a selected time to said tool to create said bond, the method comprising the steps of:

testing for occurrence of said touchdown signal prior to commanding said overtravel position;

responding to the occurrence of said touchdown signal by lowering said carriage to said overtravel position;

performing a bonding operation;

causing said carriage to ascend away from said bond site after completion of said bonding operation; and computing the distance said carriage moves during the time interval between the beginning of its ascension away from said bond site and the occurrence of said second change in said open/close state.

\* \* \* \* \*